United States Patent [19]
Zwack

[11] 3,993,992
[45] Nov. 23, 1976

[54] CIRCUIT ARRANGEMENT FOR CONVERTING ANALOG SIGNALS INTO PCM SIGNALS AND PCM SIGNALS INTO ANALOG SIGNALS

[75] Inventor: Eduard Zwack, Munich, Germany

[73] Assignee: Siemens Aktiengesellschaft, Munich, Germany

[22] Filed: June 26, 1974

[21] Appl. No.: 483,144

[30] Foreign Application Priority Data
June 29, 1973 Germany............................ 2333298

[52] U.S. Cl. ..................... 340/347 C; 340/347 AD; 340/347 DA; 179/15 AV
[51] Int. Cl.² ......................................... H03K 13/02
[58] Field of Search ......... 179/15 AV; 340/347 AD, 340/347 DA, 347 C, 347 DD

[56] References Cited
UNITED STATES PATENTS

| | | | |
|---|---|---|---|
| 2,715,678 | 8/1955 | Barney | 340/347 C |
| 2,865,564 | 12/1958 | Kaiser et al. | 340/347 C |
| 3,065,422 | 11/1962 | Villars | 340/347 C |
| 3,105,230 | 9/1963 | MacIntyre | 340/347 C |
| 3,251,052 | 5/1966 | Hoffman et al. | 340/347 C |
| 3,414,818 | 12/1968 | Reidel | 340/347 NT |
| 3,449,741 | 6/1969 | Egerton | 340/347 C |
| 3,510,868 | 5/1970 | Chatelon | 340/347 AD |
| 3,573,795 | 4/1971 | Bowers et al. | 340/347 AD |
| 3,653,035 | 3/1972 | Carbrey | 340/347 C |
| 3,789,392 | 1/1974 | Candiani | 340/347 DD |
| 3,883,864 | 5/1975 | Thomas | 340/347 AD |
| 3,887,911 | 6/1975 | Bell | 340/347 DA |

Primary Examiner—Thomas J. Sloyan
Attorney, Agent, or Firm—Schuyler, Birch, Swindler, McKie & Beckett

[57] ABSTRACT

An analog signal PCM signal/PCM signal-analog signal converter having a sawtooth generator, the sawtooth voltage of which is compared in a first comparator with the analog signal to be converted, the sawtooth signal being represented in instantaneous amplitude by code chains provided by a register which also provides timing pulses coincident with the pulse rate of the PCM signals. The analog comparator controls the forwarding of the code chain corresponding to the analog signal to be converted and delivered through a compandor which allows for non-linear signals.

Incoming PCM signals are compared with the code chains as fed through the compandor in a digital comparator which utilizes a positive result to gate the sawtooth voltage output and generate an analog signal.

7 Claims, 1 Drawing Figure

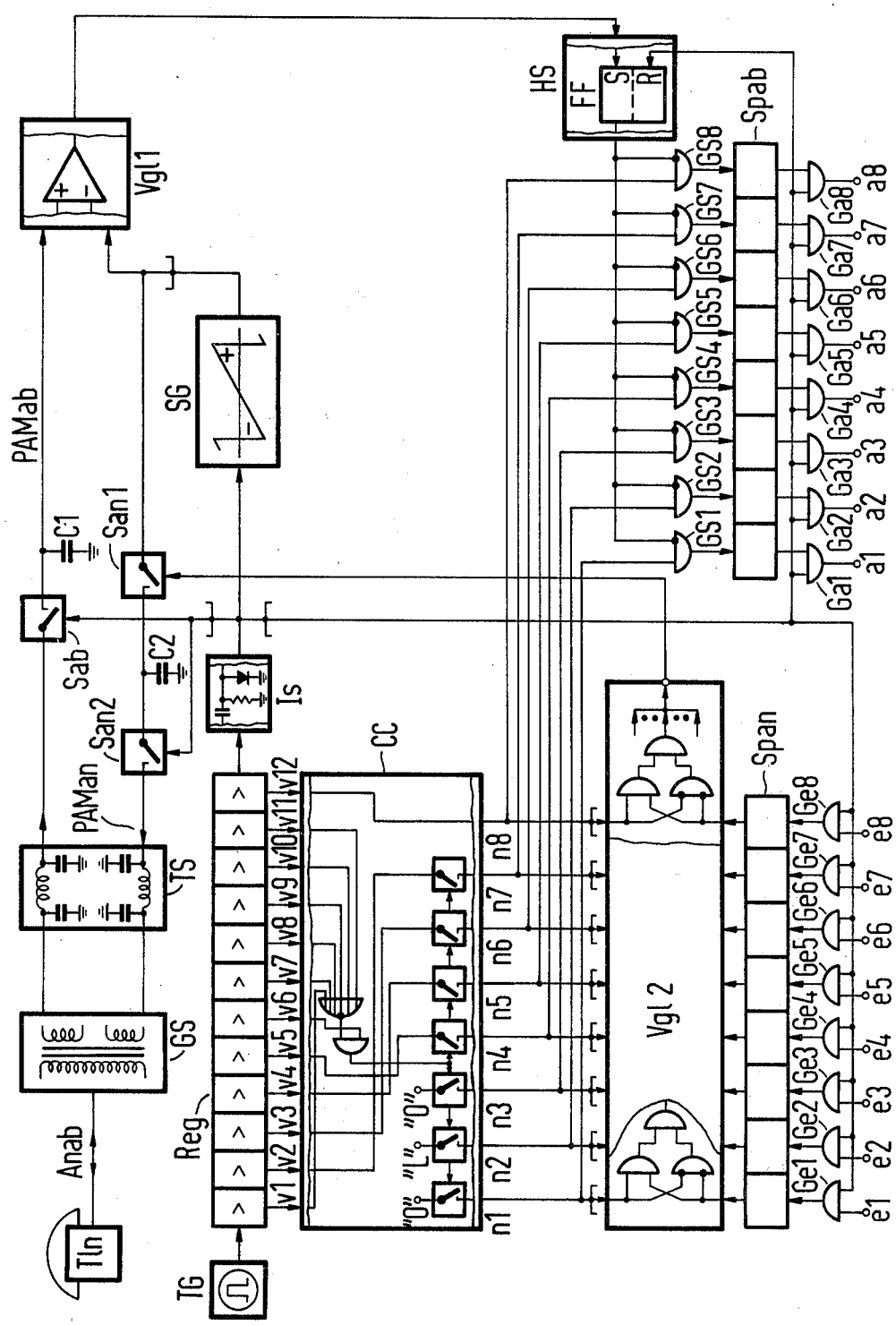

CIRCUIT ARRANGEMENT FOR CONVERTING ANALOG SIGNALS INTO PCM SIGNALS AND PCM SIGNALS INTO ANALOG SIGNALS

BACKGROUND OF THE INVENTION

When transmitting communication signals between a master or transmitting station and a slave or receiving station, communication signals present in analog form must frequently be transmitted in digital form over the transmission circuits connecting the master station with the slave station. In the process, the communication signals concerned are frequently transmitted in pulse code modulated (PCM) form. However, they are frequently first available in pulse amplitude modulated (PAM) form at the sending end. And after transmission to the slave station as PCM signals, they must often be forwarded again at the receiving end as PAM signals.

In connection with the conversion of PAM signals into PCM signals, it is old in the art (West German Unexamined Pat. No. 1,913,132) to compare the PAM signal with a uniformly varying reference voltage, i.e., a sawtooth voltage and, in case of similarity, to establish a criterion whereby a counter governed by clock signals is stopped at the start of the comparison; the counter position defines the PCM signal representing the PAM signal being converted. In the above context, it is likewise old to use the PCM signal for the conversion of PCM signals into analog signals to control a sawtooth generator to supply a signal corresponding in amplitude to the bit combination thereof. For this purpose, a counter is accordingly set by means of the PCM signal concerned after its line-to-store transfer in a shift register, said counter being operated such that its counter position is restored to zero. When the home position is reached, a disconnect signal is delivered to a scanning and storage circuit which stores the instantaneous amplitude of a sawtooth voltage supplied by said sawtooth generator; the sawtooth generator concerned starts supplying the sawtooth voltage at the moment when the counter starts counting down. Although analog signals can be converted into PCM signals and PCM signals into analog signals by means of the prior art arrangements referenced above, a fairly large amount of circuitry is necessary nevertheless. Moreover, these prior art arrangements are only capable of causing a linear conversion of analog signals into PCM signals and of PCM signals into analog signals, which is often undesirable.

A further digital-to-analog converter has become known (West German Unexamined Pat. No. 1,938,690), which also employs a sawtooth generator for the purpose of converting a digitally encoded signal into an analog signal. This sawtooth generator starts delivering a sawtooth voltage at the moment when a counter is caused to take successively different positions to which corresponding signals representing the digitally encoded signal being converted are compared in a comparator. If this comparator detects correspondence between the digitally encoded signal being converted and the signal corresponding to a position of said counter, it actuates a switching device connecting the outlet of the sawtooth generator with a storage capacitor on which, consequently, the instantaneous amplitude of the sawtooth voltage available at the closing instant of the switching device is stored. This prior art converter, too, causes only a linear conversion of the digitally encoded signal concerned into an analog signal. Likewise, no measures whatever are taken in this case to convert a digitally encoded signal into an analog signal which take into account a non-linear characteristic.

As mentioned hereinbelow, a conversion of analog signals into PCM signals and a conversion of PCM signals into analog signals is frequently desirable, wherein account may be taken of a non-linear characteristic or a bend characteristic. To carry out said conversion, a commonly used technique (West German Examined Patent Application No. 1,537,970) is to employ a coder used for PCM transmission systems operating according to the feedback principle and having a non-linear companding characteristic with multiple bends, and a decoder having a non-linear companding characteristic with multiple bends. The coder is so constructed that an analog signal being converted into a PCM signal is fed into one input of a comparator, a varying reference voltage supplied by a voltage source being fed into another input. The voltage source is triggered from a clock-actuated logic element over a code converter to supply a voltage which varies according to a desired course, that is to say, along the course of a non-linear companding characteristic with multiple bends. If the comparator detects a correspondence between the analog signal fed thereinto and the voltage supplied by said voltage source, it delivers a signal, in reaction to which a code combination is provided by the logic element and the companded PCM signal corresponding to the analog signal concerned.

In the decoder, the PCM signal, after being received by a shift register and forwarded by transfer gate circuits and by a 7-bit storage, is fed into a code converter, which triggers at its outgoing end a voltage source corresponding to the above voltage source, from which the analog signal corresponding to the PCM signal concerned (but presently expanded again) is delivered at the outgoing end. Such voltage sources are particularly formed by resistor ladder networks which are triggered by constant currents.

Although the last-mentioned prior art coder permits a conversion of analog signals into PCM signals, taking account of a non-linear bend characteristic, and the last-mentioned decoder permits a conversion of PCM signals into analog signals, taking into account a non-linear bend characteristic, a fairly large amount of circuitry is still necessary. This is particularly true of the voltage sources and code converters to be separately provided in the coder and the decoder.

SUMMARY OF THE INVENTION

It is an object of the invention to provide a circuit arrangement for converting analog signals into PCM signals and PCM signals into analog signals with a fairly small amount of circuitry and avoiding the drawbacks inherent in the prior art arrangements cited above, while at the same time accomplishing a conversion which takes account of a non-linear bend characteristic.

In accordance with the invention, the foregoing and other objects are achieved by a circuit arrangement for converting analog signals delivered from a master station and particularly formed by PAM signals into PCM signals, and PCM signals into analog or PAM signals, wherein for the conversion of an analog signal delivered from the master station into a PCM signal a sawtooth voltage is compared with the analog signal; concurrently code chains are stored which are delivered during the occurrence of the sawtooth voltage and which correspond to the current instantaneous amplitude of the sawtooth voltage. The code chain present in case of similarity between the instantaneous amplitude of the analog signal and the sawtooth voltage is usable as a PCM signal corresponding to the analog signal. For converting PCM signals into analog signals to be fed into the slave station the PCM signal concerned is used to cause the delivery of a signal corresponding to the bit combination thereof which defines its amplitude as established from a sawtooth voltage. The sawtooth voltages are delivered from a single sawtooth generator which, governed at a control input by successive pulses delivered from an output of a multistage counter over a time interval corresponding to the time interval of particular consecutively appearing PCM signals intended for the slave station, delivers between two such pulses a sawtooth voltage, to the prevailing amplitude of which corresponds a code chain delivered from the individual stages of the counter. One input of an analog comparator is connected to the output of the sawtooth generator and over a switching device the input of the slave station; the other input of the analog comparator is connected to the master station over another switching device. The individual stages of the counter are connected at the outgoing end to an incoming end of a digital comparator over a compandor with a non-linear companding characteristic, said digital comparator receiving at another incoming end the PCM signals to be converted into analog signals to be fed into the slave station. The digital comparator is connected at the outgoing end to an operating input of the other switching device. At the outgoing end of the compandor a storage device is connected which buffers the code chains delivered therefrom. In contrast to the prior art devices described hereinabove, the invention has the advantage that only a very small amount of circuitry is required. According to the invention, the master station and slave station one can accomplish the conversion with only one sawtooth generator, and one counter for storing the code chains delivered in the process which correspond to the current instantaneous amplitude of the sawtooth voltage delivered from the sawtooth generator, and with only one compandor. This system is thereby able to convert into PCM signals the analog signals delivered from the master station and to convert PCM signals into analog signals to be fed into the slave station, taking account of a non-linear bend characteristic in each case. Another advantage is that both conversions concerned can be accomplished concurrently. Furthermore, the sawtooth generator, the counter, and the compandor can concurrently be utilized for a multiplicity of master and slave stations with respect to the conversion into PCM signals of analog signals, and of PCM signals into analog signals. All this results in a very small amount of circuitry.

According to an advantageous development of the invention, the storage device stores the code chain routed thereto from the compandor at the time of a comparison signal from the analog comparator. This is the PCM signal corresponding to the analog signal being converted. This reduces the amount of circuitry needed.

According to another suitable development of the invention, the switching device mentioned above consists of two switches with one terminal connected directly to one another, a capacitor being connected to the interconnected terminals. The switch connected with its other terminal to the output of the sawtooth generator is connected with its operating input to the output of the digital comparator; the other switch is connected with its other terminal to the slave station and with its operating input to the output of the counter to which the sawtooth generator is connected with its control input. This results in a switching device that is very simple to construct and has little circuit complexity.

According to another advantageous development of the invention, the above-named other switching device is formed by a switch connected with one terminal to the master station and with its other terminal to the other input of the analog comparator, a capacitor being connected to said other terminal of this switch, the operating input of said switch being connected to the output of the counter to which the sawtooth generator is connected with its control input. Thus, this other switching device is very simple to construct and has little circuit complexity.

According to another advantageous development of the invention, the storage device comprises a dynamic storage which at the incoming end is connected to the outputs of the compandor over a write-in control circuit and at the outgoing end to a PCM transmission circuit over a write-out control circuit, the write-in control circuit having a holding circuit which, in reaction to the delivery of an output signal from the analog comparator, prevents further line-to-store transfer of signals of the compandor to the dynamic storage until the appearance of the next pulse-delivered from the counter of the pulses succeeding each other at the same time interval at which the PCM signals to be converted into analog signals appear, and the roll-out control circuit upon the appearance of one of the last-mentioned pulses switches the outgoing end of the dynamic storage to the outgoing PCM transmission circuit. The result is an extremely small circuit complexity with regard to the storing of the PCM signal corresponding to the current analog signal prior to its delivery to the PCM transmission circuit.

According to still another advantageous development of the invention, the PCM signals to be converted into analog signals are written into another dynamic storage connected at the outgoing end to said other incoming end of the digital comparator over a write-in control circuit which, in reaction to pulses succeeding one another at the same time interval at which the PCM signals to be converted into analog signals appear, can be controlled into the transmittable state. This results in an extremely small circuit complexity for the temporary storage of the PCM signals to be converted into analog signals.

BRIEF DESCRIPTION OF THE DRAWINGS

The principles of the invention will be more readily understood by reference to the description of a preferred embodiment given hereinbelow in connection with the drawing which is a schematic diagram of a preferred embodiment of a circuit arrangement constructed according to the invention.

DETAILED DESCRIPTION OF PREFERRED EMBODIMENTS

The circuit arrangement shown in the drawing is employed to convert the analog signals delivered from subscribing stations such as station T1n, into PCM signals and for converting the PCM signals into analog signals which thereafter are fed to the subscriber stations concerned. The conversion of the analog signals into PCM signals and the conversion of the PCM signals into analog signals will in each case occur while taking account of a non-linear bend characteristic, i.e., a companding characteristic in the present instance.

To perform the converting operation mentioned above, the circuit arrangement shown in the drawing has a multistage register Reg controlled by a clock generator TG, which operates as a purely binary-operated frequency scaler and is followed by a compandor CC, which will be described further below. This compandor CC provides at its outgoing end the number of bits necessary to form a PCM signal or a PCM word, i.e., 8 bits in the present case. In comparison thereto, the compandor CC is triggered by a greater number of bits, i.e., 12 bits in the present instance. To achieve the dependence corresponding to a desired non-linear companding characteristic between the bit strings fed to the compandor CC at the incoming end and the bit strings delivered therefrom at the outgoing end, the compandor is designed to realize the following conversion:

bit/output bit diagram is provided by said byte 010 appearing at outputs $n1$ $n2$, and $n3$ of the compandor CC (cf., e.g., West German Display Copy No. 1,537,970, FIG. 1).

With regard to the input bit string abcd0000000, which is shown in the lowermost row of the table, it is to be noted that in this case an AND element can be dispensed with, as mentioned hereinabove. In this case, the output signal of the NOR element, to which all the 0 bits indicated above are routed, is used directly to operate the switches provided.

As can be seen from the table above, four consecutive bits at a time, i.e., the bits $a$, $b$, $c$, and $d$, are delivered from the compandor CC at the outgoing end in unaltered form. In this connection, the position of the four bits in the input bit string, is determined by the high-order bits of the input bit string, as shown in the left-hand portion of the table above.

In the above table and in the preceding discussion, only 11 input bits and seven output bits have been considered; the twelfth input bit and the eighth output bit convey the algebraic sign of the bit string concerned. This means that the input $v12$ of the compan-

| | | | | input bits (linear) | | | | | | | | | output bits (companded) | | | | |
|---|---|---|---|---|---|---|---|---|---|---|---|---|---|---|---|---|---|
| $v11$ | $v10$ | $v9$ | $v8$ | $v7$ | $v6$ | $v5$ | $v4$ | $v3$ | $v2$ | $v1$ | $n1$ | $n2$ | $n3$ | $n4$ | $n5$ | $n6$ | $n7$ |
| 1 | d | c | b | a | 0 | 0 | 0 | 0 | 0 | 0 | 1 | 1 | 1 | d | c | b | a |
| 0 | 1 | d | c | b | a | 0 | 0 | 0 | 0 | 0 | 1 | 1 | 0 | d | c | b | a |
| 0 | 0 | 1 | d | c | b | a | 0 | 0 | 0 | 0 | 1 | 0 | 1 | d | c | b | a |
| 0 | 0 | 0 | 1 | d | c | b | a | 0 | 0 | 0 | 1 | 0 | 0 | d | c | b | a |
| 0 | 0 | 0 | 0 | 1 | d | c | b | a | 0 | 0 | 0 | 1 | 1 | d | c | b | a |
| 0 | 0 | 0 | 0 | 0 | 1 | d | c | b | a | 0 | 0 | 1 | 0 | d | c | b | a |
| 0 | 0 | 0 | 0 | 0 | 0 | 1 | d | c | b | a | 0 | 0 | 1 | d | c | b | a |
| 0 | 0 | 0 | 0 | 0 | 0 | 0 | d | c | b | a | 0 | 0 | 0 | d | c | b | a |

To perform the logic operations shown in the table above, the compandor CC may be built such that it routes the particular input bits formed by a 0 to a NOR element, the output signal of which is used to operate switches which switch particular input bits labeled $a$, $b$, $d$, or $d$, when the NOR element concerned delivers a signal that renders said switches transmittable. In this connection, the output signal of the NOR element is, where necessary, also connected over an AND element to a byte formed by the particular 0 bits and to an 1 bit located between the byte formed by the particular 0 bits and the byte $a$, $b$, $c$ and $d$. This case is illustrated in the table. With reference to the table above and the drawing of the compandor CC it can be seen how the input bit chain 0abcdL00000 located at the inputs $v1$, $v2$, $v3$, $v4$, $v5$, $v6$, $v7$, $v8$, $v9$, $v10$ and $v11$ is converted. Accordingly, the 0 bits of the byte 00000 and the 0 bit located in front of the a bit are routed to a NOR element which is connected at the outgoing end to one input of an AND element which receives with its other input, from the input $v6$, the 1 bit located between said byte 0000 and the byte abcd. The four switches shown in the right-hand portion of the compandor CC depicted in the drawing are closed by the 1 bit delivered from the output of said AND element, as a result of which the bits $a$, $b$, $c$, and $d$ mentioned above are delivered directly to outputs $n7$, $n6$, $n5$, and $n4$ of the compandor CC. The output signal of the AND element concerned is further used to operate three other switches, at one terminal of which signals corresponding to an 0, 1 or 0 bit are applied. An address which fixes the position of the bytes dcba within an input dor CC receiving the twelfth bit of the input bit string can be connected directly to the eighth output $n8$ of the compandor CC. Furthermore, it is possible to route the bit appearing at the input $v12$ of the compandor CC directly to an output of the compandor preceding the output $n1$.

On the one hand, a digital comparator $Vg12$, which compares digital signals, is connected to inputs associated with one input side thereof at the outputs $n1$ to $n8$ of the compandor CC. The inputs of the digital comparator $Vg12$ associated with the other input side are connected to the outputs of a storage S*pan* whereby, for example, charged carrier storage may be provided in the form of a MOSFET, storage device. With regard to the digital comparator $Vg12$, the term implies that it consists of exclusive OR elements, each of which compares corresponding bits of the bit strings fed from the compandor CC and of the bit strings routed from the storage S*pan*, and which deliver an 1 signal at the output of the comparator only if all the bits being compared are similar.

The storage Span is connected at the incoming end to the outputs of a write-in control circuit comprising the AND elements $Ge1$, $Ge2$, $Ge3$, $Ge4$, $Ge5$, $Ge6$, $Ge7$ and $Ge8$, which are connected with one input to input terminals $e1$, $e2$, $e3$, $e4$, $e5$, $e6$, $e7$ or $e8$ to which, in the present case, eight transmission lines of an incoming PCM transmission circuit may be connected. PCM signals coming in over said PCM transmission circuit, each comprising eight bits, are rolled into the storage Span when the aforesaid AND elements $Ge1$ to $Ge8$ are in the transmittable status. For this purpose, the AND elements concerned (G$e$1 to G$e$8) are jointly connected via their other inputs to the output of a pulse-shaping circuit I$s$ following the aforesaid register R$eg$. Where necessary, this pulse-shaping circuit can be dispensed with, particularly if appropriate external control or synchronization pulses are employed instead of the pulses delivered therefrom. In the present case, consecutive pulses are delivered at the same time interval from said pulse-shaping circuit I$s$, which essentially comprises a differentiating circuit containing a capacitor and a leakage resistor, and a diode connected in parallel to the resistance of the differentiating circuit; the PCM signals transmitted over the incoming PCM transmission circuit appear with said consecutive pulses. To compensate for time differences in the appearance of the particular PCM signals and said pulses, an adjustable delay line may be inserted into the line connecting the output of the pulse shaping circuit I$s$ with the other inputs of the AND elements G$e$1 to G$e$8. Let it be assumed that in the instant case the interval at which said pulses and PCM signals appear is 125 $\mu$s. Since the register Reg consists of 12 stages which cause a purely binary frequency scaling, this means that the clock generator TG must operate at a clock pulse frequency of 32.768 MHz.

Furthermore, one input of a sawtooth generator SG is connected to the output of the pulse-shaping circuit I$s$. The sawtooth generator SG delivers in response to each pulse fed thereto from the pulse-shaping circuit I$s$ a sawtooth voltage that increases from a negative voltage to a positive voltage. The sawtooth generator SG is so constructed that it starts resupplying a sawtooth voltage every time such a pulse appears. The output of the sawtooth generator SG is connected with one input of an analog comparator V$g$11, which, in the present case, comprises a differential amplifier. Moreover, the output of the sawtooth generator SG is connected over a switching device comprising two switches S$an$1, S$an$2 connected directly to one another. One plate of a capacitor C2 is connected to their common connecting point, while its other plate is grounded; a low-pass filter TS is connected with the input side of a hybrid terminating set GS, to which the subscriber station T1$n$ is connected over an interchange trunk A$nab$. The switch S$an$1 of the aforesaid switching device is connected with its operating input to the output of the digital comparator V$g$12. The operating input of the switch S$an$2 of this switching device is connected to the output of the pulse-shaping circuit I$s$.

The other input of the analog comparator V$g$11, which compares analog signals, is connected over an interexchange trunk PAM$ab$ and over another switching device comprising a switch S$ab$ and a capacitor C1 connected with one plate to the common terminal of said switch and the analog comparator V$g$11, as well as over the low-pass filter TS with the sending end of the hybrid circuit GS. The other plate of the capacitor C1 is grounded. The above-mentioned switch may be an electronic switch, more particularly a MOSFET switch, just as all the other switches mentioned in this connection.

The output of the analog comparator V$g$11 is connected to the input of a locking relay HS, which is associated with a write-in control circuit. The write-in control circuit comprises, in addition to the holding circuit HS, a number of blocking elements, i.e., the blocking elements GS1, GS2, GS3, GS4, GS5, GS6, GS7 and GS8. These blocking elements GS1 to GS8 have their blocking inputs jointly connected to the output of the holding circuit HS. The signal inputs, that is to say, the non-inverting inputs of these blocking elements GS1 to GS8 are connected to the outputs of the compandor CC. In the simplest case, the holding circuit HS may be formed by a flip-flop FF, which is connected with its set input S to the output of the analog comparator V$g$11 and with its reset input R to the output of the pulse-shaping circuit I$s$. The output of the flip-flop FF, which upon the feeding of an 1 bit to the set input S carries an 1 bit, is connected to the blocking inputs of the blocking elements GS1 to GS8.

The outputs of the blocking elements GS1 to GS8 are connected to the inputs of another storage S$pab$ which preferably comprises a dynamic storage. In this case, a dynamic storage is understood to mean a storage which permits its storage status to be retained for a predetermined period, say 125 $\mu$s. A write-out control circuit is connected to the outputs of the storage stages concerned. Said roll-out circuit consists of AND elements G$a$1, G$a$2, G$a$3, G$a$4, G$a$5, G$a$6, G$a$7, G$a$8, which are connected with one input to the outputs of said stages of the storage S$pab$ and which are jointly connected with their other inputs to the output of the pulse-shaping circuit. The outputs of said AND elements G$a$1 to G$a$8 are connected to connection terminals $a$1, $a$2, $a$3, $a$4, $a$5, $a$6, $a$7 or $a$8, to which may be connected PCM transmission lines associated with an outgoing PCM transmission circuit.

After the above description of the construction of the circuit arrangement shown in the drawing, the operating mode of said circuit arrangement will now be explained:

Let it first be assumed that an analog signal delivered from the subscriber station T1$n$ to the master station is to be converted into a PCM signal, taking into account a non-linear companding characteristic. The analog signal delivered from the subscriber station T1$n$ over the interexchange trunk A$nab$, hybrid circuit GS and the low-pass filter TS travels to one terminal of the switch S$ab$. This switch is closed every 125 $\mu$s by the output of the pulse-shaping circuit I$s$ for the duration of one bit of the bits forming a PCM signal. In the instant case, the make-time of the switch S$ab$ may be about 0.5 $\mu$s. In reaction to the closing of the switch S$ab$, a scanning sample of the aforesaid analog signal is applied to the capacitor C1.

In reaction to the delivery of a pulse from the pulse-shaping circuit I$s$, which closes the switch S$ab$, the counter R$eg$ starts a counting operation within which appear all the possible register stage settings. The triggering of the sawtooth generator SG occurring in reaction to such counting operation causes the latter to deliver from its output a sawtooth voltage which may preferably have a linear characteristic. This sawtooth voltage is compared in the analog comparator V$g$11 with the stored scanning sample in C1. If the comparator V$g$11 detects a correspondence between the signals being compared, it delivers an 1 signal to the holding circuit HS, setting the flip-flop FF located in the holding circuit. The flip-flop FF has previously been reset by the pulse delivered from the output of the pulse-shaping circuit I$s$. The setting of the flip-flop FF applies a blocking signal to each of the blocking elements GS1 to GS8 connected to the inputs of the storage stages of the dynamic storage S$pab$. This causes the bit string written into said storage stages and corresponding to the status of the register R$eg$ or of the output bit string of the compandor CC — said bit being available at the output of the compandor CC at the instant the 1 signal is delivered from the analog comparator V$g$11 — to be retained in the dynamic storage S$pab$, i.e., at least up to the time when this storage is connected to the outgoing PCM transmission circuit over the write-out circuit comprising the AND elements G$a$1 to G$a$8 over the output terminals A1 to A8. It is to be noted in this connection that the storage S$pab$, the write-in control circuit connected therewith, and the write-out control circuit likewise connected therewith can be dispensed with, if the outputs of the compandor CC controlled by the output signal of the analog comparator V$g$11 are scanned.

Let it now be assumed that a PCM signal appearing over the incoming PCM transmission circuit at the input terminals $e$1 to $e$8 is to be converted into an analog signal to be fed into the subscriber station T1$n$ functioning as the slave station, taking into account a non-linear characteristic or companding characteristic. The PCM signal appearing at the input terminals $e$1 to $e$8 travels, at the moment when an output pulse from the pulse-shaping circuit I$s$ is applied the AND elements G$e$1 to G$e$8 to the storage stages of the dynamic storage S$pan$. The digital comparator V$g$12 connected with said dynamic storage S$pan$ and with the outputs of the compandor CC presently compares the bits occurring at the various positions of the register R$eg$ and delivered from the output of the compandor CC with the bits in the dynamic storage S$pan$. If the digital comparator V$g$12 detects a correspondence between the bits being compared, it delivers a leading 1 signal to close the switch S$an$1. The voltage prevailing at this moment across the output of the sawtooth generator SG is thus stored on the capacitor C2. The next output pulse from the pulse-shaping circuit I$s$ closes the switch S$an$2 feeding a signal corresponding to the signal across the capacitor C2 into the subscriber station T1$n$ over the low-pass filter TS and the hybrid circuit GS.

It has been explained hereinabove how an analog signal delivered from the subscriber station T1$n$ is converted into a (companded) PCM signal, taking into account a non-linear bend characteristic or a companding characteristic and how a PCM signal, taking account of such a non-linear bend characteristic is converted into an analog signal to be fed to the subscriber station T1$n$. Such processes take place independently of one another; they may occur concurrently. With regard to the switching elements employed for the conversions explained hereinabove and comprising the clock generator TG, the register R$eg$, the pulse-shaping circuit I$s$, the sawtooth generator SG and the compandor CC, it is to be noted that the switching elements can be utilized not only for the particular subscriber station T1$n$ but for a multiplicity of such subscriber stations. For each such subscriber station only the remaining switching elements shown in the drawing need to be provided separately. This is illustrated in the drawing by means of multiplication signs indicated in suitable places, whereby the conversion processes under consideration may occur simultaneously in all the subscriber stations provided.

Other modifications of the described invention may occur to those skilled in the art which do not depart from the spirit and scope of this invention which is to be defined by the appended claims:

I claim:

1. A circuit arrangement for converting analog signals for transmission to and from a slave station to PCM signals for transmission and reception over transmission lines, by comparing said analog signals with a reference sawtooth voltage signal represented by a code chain, comprising
   a single sawtooth voltage generator for providing said sawtooth voltages
   a multistage counter having an output connected to an input of said sawtooth generator and comprising means for providing pulses to said generator, representing the intervals of said received and transmitted PCM signals, the stages of said counter providing at their outputs a code chain representing the instantaneous amplitude of said sawtooth voltage
   an incoming store for storing the received PCM signal and an outgoing store for storing the outgoing PCM signal,
   a digital compandor having a non-linear characteristic coupled between the individual stages of said counter and the stages of said outgoing store,
   a digital comparator for comparing the outputs of said compandor with the received signal in said incoming store,
   a first switching device connected between said sawtooth voltage output and said slave station having an operating control input running to the output of said digital comparator, whereupon on detection of equality between said received PCM signal and said companded code chain, the analog signal developed by said sawtooth generator is transferred to said slave station,
   an analog comparator having a first input connected over a second switching device to an output of said slave station for receiving analog signals therefrom and a second input connected to the output of said sawtooth, generator, and
   input control means having outputs coupled to said outgoing PCM store and having inputs from said digital compandor and said analog comparator for storing said companded code chain as an outgoing PCM signal representing said received analog signal upon detection of equality between said received analog signal and an instantaneous value of said sawtooth voltage.

2. The circuit arrangement of claim 1 wherein said first switching device comprises first and second switches having one terminal connected in common, a capacitor being connected to the output of the sawtooth generator, the operating input of said first switch being connected to the output of the digital comparator, the second terminal of said second switch being connected to the slave station, the operating input thereof being connected to the output of the pulse series supply means to which the sawtooth generator is connected with its control input, whereby an analog representation of said received PCM signal is stored on said capacitor and transferred to said slave station as an analog representation thereof.

3. A circuit arrangement as claimed in claim 2, characterized in that said second switching device comprises a switch having one terminal connected to the slave station and the other terminal connected to the other input of the analog comparator, a second capacitor being connected to said other terminal of said switch, and that the operating input of said switch is connected to the output of the pulse series supply means to which the sawtooth generator is connected with its control input so that said second capacitor stores an accurate representation of the analog signal to be compared to said sawtooth voltage.

4. A circuit arrangement as claimed in claim 1, characterized in that said second switching device comprises a switch having one terminal connected to the slave station and the other terminal connected to the other input of the analog comparator, a second capacitor being connected to said other terminal of said switch, and that the operating input of said switch is connected to the output of the pulse series supply means to which the sawtooth generator is connected with its control input so that said second capacitor stores an accurate representation of the analog signal to be compared to said sawtooth voltage.

5. The circuit arrangement as claimed in claim 1 wherein said input control circuit has inputs connected to the outputs of the compandor, the write-in control circuit including holding circuit means responsive to the delivery of an output signal from the analog comparator, to prevent further transfer of signals from the compandor to the outgoing storage until the appearance of the next pulse delivered from the pulse series supply means of the pulses succeeding one another in the same time interval at which the PCM signals to be converted into analog signals appear.

6. The circuit arrangement as claimed in claim 5 including a write-out circuit coupled between said outgoing store and said transmission line and responsive to a pulse from said pulse supply to transfer said PCM signal to said trasmission line.

7. The circuit arrangement as defined in claim 6 comprising means for writing the PCM signals to be converted into analog signals into said incoming dynamic storage, said writing means being responsive to the reception of said pulses from said pulse supply succeeding one another at the same time interval in which the PCM signals to be converted into analog signals appear.

* * * * *